(12) United States Patent
Yao et al.

(10) Patent No.: US 8,853,771 B2
(45) Date of Patent: Oct. 7, 2014

(54) SUPERJUNCTION DEVICE

(71) Applicant: Shanghai Hua Hong NEC Electronics Co., Ltd., Shanghai (CN)

(72) Inventors: Liang Yao, Shanghai (CN); Jiquan Liu, Shanghai (CN); Yuanyuan Yu, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/888,570

(22) Filed: May 7, 2013

(65) Prior Publication Data
US 2013/0299896 A1    Nov. 14, 2013

(30) Foreign Application Priority Data
May 8, 2012   (CN) .......................... 2012 1 0139893

(51) Int. Cl.
*H01L 29/66* (2006.01)
*H01L 29/06* (2006.01)
*H01L 29/78* (2006.01)
*H01L 29/10* (2006.01)
*H01L 29/04* (2006.01)

(52) U.S. Cl.
CPC ......... *H01L 29/0603* (2013.01); *H01L 29/1095* (2013.01); *H01L 29/66712* (2013.01); *H01L 29/045* (2013.01); *H01L 29/7827* (2013.01); *H01L 29/0634* (2013.01); *H01L 29/7811* (2013.01); *H01L 29/0696* (2013.01)
USPC ...................................................... 257/329

(58) Field of Classification Search
USPC ......................................................... 257/329
See application file for complete search history.

(56) References Cited

U.S. PATENT DOCUMENTS

| | | | | |
|---|---|---|---|---|
| 8,283,720 B2 * | 10/2012 | Saito et al. | .................... | 257/328 |
| 2002/0185705 A1 * | 12/2002 | Saitoh et al. | .................. | 257/492 |
| 2011/0024831 A1 * | 2/2011 | Nakano | ........................ | 257/330 |

* cited by examiner

*Primary Examiner* — Timor Karimy
(74) *Attorney, Agent, or Firm* — MKG, LLC

(57) ABSTRACT

A superjunction device in which corner portions of each annular-shaped second trench are composed of a plurality of alternately arranged first sides and second sides. The first sides are parallel to a plurality of parallel arranged first trenches in a current-flowing area, while the second sides are perpendicular to the first sides and the first trenches. Such design ensures that Miller indices of sidewalls and bottom face of any portion of each second trench belong to the same family of crystal planes. Moreover, with this design, the corner portions of the second trenches can be filled with a silicon epitaxial material at the same rate with the rest portions thereof, which ensures for the second trenches to be uniformly and completely filled without any defects in the corner portions and hence improve the performance of the superjunction device.

11 Claims, 3 Drawing Sheets

SUPERJUNCTION DEVICE

CROSS-REFERENCES TO RELATED APPLICATIONS

This application claims the priority of Chinese patent application number 201210139893.9, filed on May 8, 2012, the entire contents of which are incorporated herein by reference.

TECHNICAL FIELD

This disclosure relates generally to devices for use in semiconductor integrated circuits, and more particularly, to a superjunction device.

BACKGROUND

Superjunction devices employ a structure composed of alternately arranged N-type pillars and P-type pillars. When an N-channel superjunction metal-oxide semiconductor field-effect transistor (MOSFET) is in an on-state, the on-state current will flow in the N-type pillars; while when it is in an off-state, the depletions between N-type and P-type pillars will enable a high breakdown voltage. Therefore, the breakdown voltage will not be decreased even when a relatively thin N-type epitaxial layer with a high concentration of N-type dopant is formed. Thus, the N-channel superjunction MOSFET can have a low on-resistance (Rson) while maintaining a high breakdown voltage. Similarly, a P-channel superjunction MOSFET also has such property while having the conductivity types of relevant elements opposite to those of the N-channel one.

Despite their merit of having a high breakdown voltage and a low Rson at the same time, there are still many issues that need to be addressed for conventional superjunction devices, such as the difficulties in forming the P-type pillars and N-type pillars and designing a proper termination structure.

As superjunction devices have a higher dopant concentration in their epitaxial layer, the termination design with floating rings and field plates that has been adopted in vertical double-diffused metal-oxide semiconductor (VDMOS) transistors is not applicable to conventional superjunction devices. Instead, conventional superjunction devices typically employ a termination structure in which the trenches are designed to have an annular shape. Such termination structure is achieved by first forming the annular-shaped trenches and then filling the trenches with an epitaxy material such as silicon to form P-type pillars or N-type pillars therein. In this process, the step of filling the annular-shaped trenches has become a great challenge to existing silicon epitaxial growth technologies. This is because the silicon epitaxial growth rate is related with the crystal orientation of the silicon surface, and epitaxial growth rate varies, and hence the filling quality varies when applied to surfaces with different crystal orientations. For the aforementioned termination structure, as the crystal orientations around the corners of an annular-shaped trench are keeping changing, the epitaxial growth rate of a trench filling process around the corners will be varying accordingly, and therefore, the filling of silicon in these portions is most challenging and defects (e.g., voids) are generally left there after the silicon filling process is completed. FIG. 1 is a top view schematically illustrating a corner portion of a conventional superjunction device. Referring to FIG. 1, parallel and equally-spaced trenches 101 are formed in a current-flowing area (i.e., an active area). A termination structure includes multiple annular-shaped trenches (only one of them is shown in FIG. 1), each of which is a corner-rounded rectangle enclosing the current-flowing area. Additionally, each annular-shaped trench is composed of a pair of first sides 102 which are straight and parallel to the trenches 101, a pair of second sides (not shown) which are straight and perpendicular to the trenches 101, and four arc-shaped portions 103 each of which is positioned at a corner of the annular-shaped trench for connecting a first side 102 to a second side that is perpendicular to the first side 102. As shown in FIG. 1, as the annular trench is always changing its extension direction in the arc-shaped portions 103, the Miller indices of trench sidewalls are varying accordingly and the Miller indices of the arc-shaped portions do not belong to the same family of crystal planes with that of the first or second straight sides. As in a silicon filling process the silicon epitaxial growth rate is dependent on the Miller indices of trench sidewalls and trench bottom face, the growth rate in the arc-shaped portions 103 is position-dependent and different with the growth rate in the trenches 101 and straight sides of the annular-shaped trenches, thus making the arc-shaped portions 103 difficult to be properly filled. FIG. 2 is an image showing the silicon filling result of arc-shaped portions of a conventional superjunction device. As indicated by a dashed circle in the figure, voids which will deteriorate the performance of the device are present in the arc-shaped portions 103 of the termination structure.

SUMMARY OF THE INVENTION

The present invention addresses the issues encountered in the prior art by presenting a superjunction device with an improved termination structure. The termination structure includes annular-shaped trenches, corner portions of which are appropriately filled without defects generated therein and hence results in performance improvement of the device.

In order to achieve the above objectives, the present invention provides a superjunction device, including: a semiconductor substrate having a first conductivity type; a semiconductor epitaxial layer having a first conductivity type, the semiconductor epitaxial layer being formed on the semiconductor substrate; a current-flowing area formed in the semiconductor epitaxial layer, the current-flowing area including a plurality of parallel arranged first trenches, each of the first trenches extending in a first direction that is parallel to a surface of the semiconductor substrate; a termination structure formed in the semiconductor epitaxial layer and enclosing the current-flowing area, the termination structure including a plurality of parallel arranged and annular-shaped second trenches, each of the second trenches including a plurality of alternately arranged first sides and second sides, each of the first sides extending in the first direction, each of the second sides extending in a second direction that is perpendicular to the first direction; and a semiconductor epitaxial material having a second conductivity type, the semiconductor epitaxial material being filled in each of the first and second trenches, wherein the semiconductor epitaxial material filled in the first and second trenches form pillars having a second conductivity type, and portions of the semiconductor epitaxial layer between every two adjacent pillars having a second conductivity type form pillars having a first conductivity type, and wherein the pillars having a first conductivity type and the pillars having a second conductivity type are alternately arranged.

In one embodiment, the semiconductor substrate is a silicon substrate. Additionally, the semiconductor epitaxial layer is a silicon epitaxial layer. Moreover, the semiconductor epitaxial material is a silicon epitaxial material.

In another embodiment, Miller indices of sidewalls and bottom face of each of the first trenches, Miller indices of sidewalls and bottom face of any portion of each of the second trenches, and Miller indices of the semiconductor substrate all belong to the {100} family of crystal planes.

In another embodiment, the first conductivity type and the second conductivity type are respectively N type and P type, or respectively P type and N type.

In another embodiment, every two adjacent first trenches have an identical spacing and the first trenches have an identical width.

In another embodiment, each of the pillars having a second conductivity type filled in a corresponding one of the first trenches has a uniform or non-uniform resistivity.

In another embodiment, each of the second trenches includes: a pair of first long sides parallel arranged and extending in the first direction; a pair of second long sides parallel arranged and extending in the second direction; and four corner portions, each formed by connecting a plurality of first short sides extending in the first direction and a plurality of second short sides extending in the second direction, each of the corner portions connecting a corresponding one of the first long sides and a corresponding one of the second long sides.

In a further embodiment, first ends of the first short sides of each corner portion are located on an arc, the first end being an end that is farther from the current-flowing area, the arc curving away from the current-flowing area.

In a further embodiment, the spacings between every two adjacent second trenches are identical or not.

In a further embodiment, each of the second trenches has an identical width which is equal to a width of the first trench.

In a further embodiment, the superjunction device further includes, in the current-flowing area: a well having a second conductivity type formed on top of each of the pillars having a second conductivity type in the current-flowing area; source regions having a first conductivity type formed in each wells; insulated control electrodes formed on the semiconductor epitaxial layer, each of the insulated control electrodes being composed of a gate dielectric layer and a gate electrode; an insulating passivation layer covering each insulated control electrode; a source composed of a first metal layer that covers the insulating passivation layers and is connected to the source regions; and a drain composed of a second metal layer over a back side of the semiconductor substrate.

In the termination structure of the superjunction device according to the present invention, the corner portions of the second (annular-shaped) trenches are designed to be composed of multiple alternately connected first and second short sides, wherein each of the first short sides are parallel to the first trenches in the current-flowing area, and each of the second short sides are perpendicular to the first trenches in the current-flowing area, as a result, the Miller indices of sidewalls and bottom face of each first trench, Miller indices of sidewalls and bottom face of any portion of each second trench, and Miller indices of the semiconductor substrate all belong to the same family of crystal planes, and therefore, the corner portions of the second trenches are filled with silicon epitaxial layer at the same rate with the rest portions thereof and hence are uniformly filled, thereby avoiding the generation of defects that may be caused by non-uniform filling and resulting in performance improvement of the superjunction device.

BRIEF DESCRIPTION OF THE DRAWINGS

To further describe the present invention, reference is made to the following detailed description on example embodiments, taken in conjunction with the accompanying drawings, in which.

DETAILED DESCRIPTION

Figure 3:
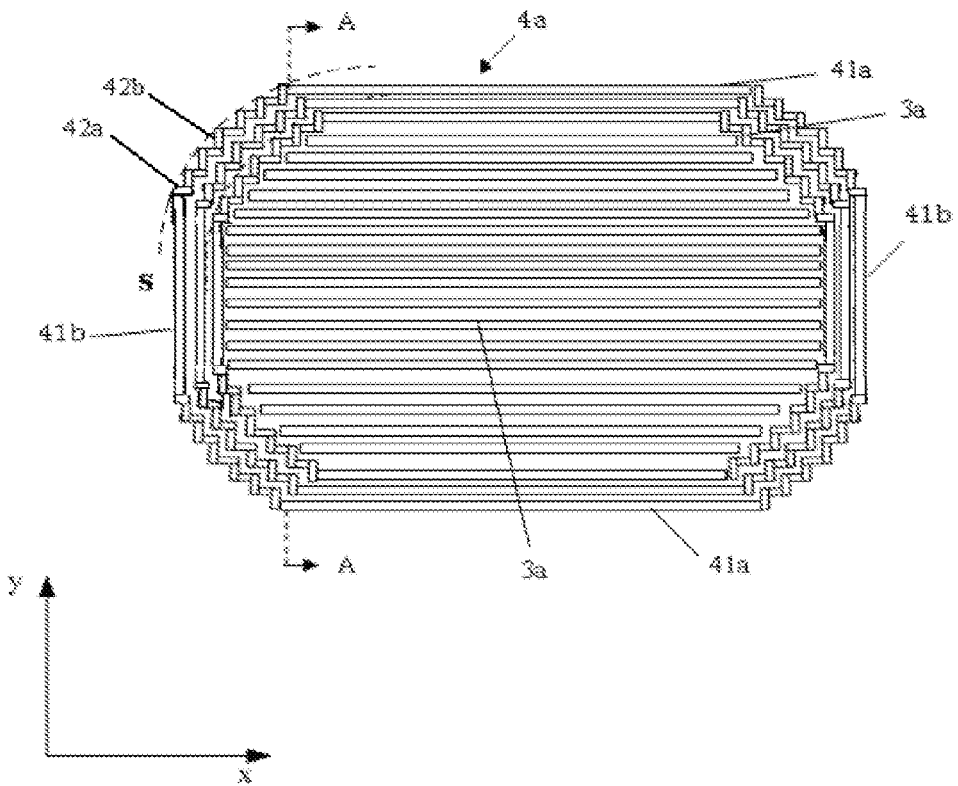
FIG. 3 is a top view taken from the top of the epitaxial layer 2 of a superjunction device according to the present invention.
Figure 4:
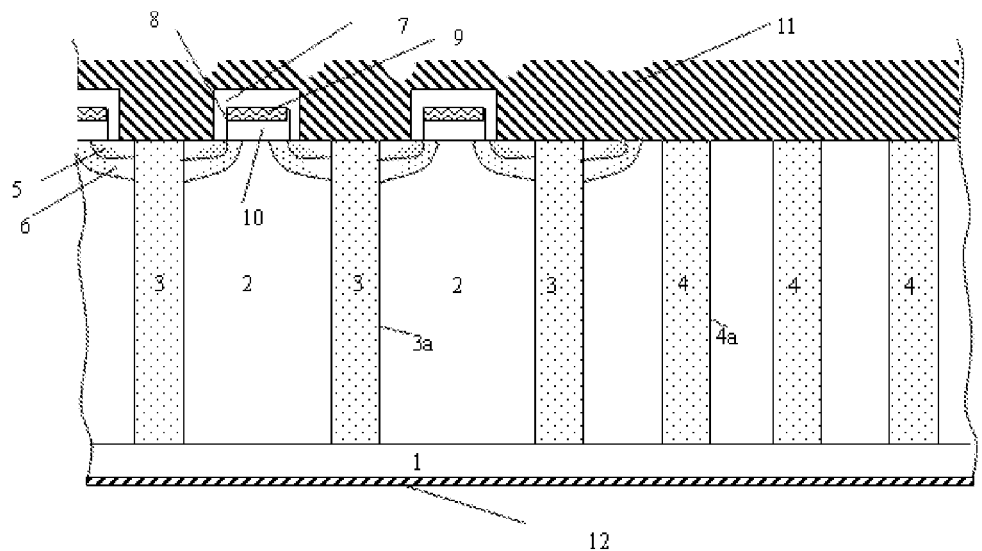
FIG. 4 is a partial cross sectional view taken along line A-A of FIG. 3.

FIG. 3 is a top view taken from the top of the epitaxial layer 2 of a superjunction device according to the present invention, wherein, those elements above the epitaxial layer 2 are not shown in FIG. 3, although included in the superjunction device, while FIG. 4 is a partial cross sectional view taken along line A-A of FIG. 3. In one embodiment, the superjunction device is an N-channel superjunction MOSFET device.

In the embodiment, the superjunction device includes an N-type semiconductor substrate 1, which may be a silicon substrate doped with arsenic (As) or antimony (Sb) having a resistivity of 0.001 Ω·cm to 0.009 Ω·cm.

Moreover, the superjunction device further includes an N-type semiconductor epitaxial layer 2 formed on the N-type semiconductor substrate 1. The semiconductor epitaxial layer 2 may be a silicon epitaxial layer which is doped with phosphorus and has a resistivity of 1 Ω·cm to 10 Ω·cm.

Further, a current-flowing area and a termination structure are formed in the semiconductor epitaxial layer 2.

The current-flowing area includes a plurality of parallel arranged first trenches 3a, each of the first trenches 3a vertically extends in a direction of depth and laterally extends through the semiconductor epitaxial layer 2 in a first direction that is parallel to a surface of the semiconductor substrate (i.e., the X-direction of FIG. 3). Every two adjacent first trenches 3a may have an identical spacing and the first trenches 3a may have an identical width.

The termination structure includes a plurality of parallel arranged and annular-shaped second trenches 4a, each of the second trenches 4a encloses the current-flowing area.

In a top view, each of the second trenches 4a may appear as a rectangle with four rounded corners. For example, each of the second trenches 4a include: a pair of first long sides 41a which are parallel arranged and extend in the X-direction; a pair of second long sides 41b which are parallel arranged and extend in the Y-direction; and four corner portions, wherein, the first long sides 41a are perpendicular to the second long sides 41b; each of the four corner portions connects a corresponding one of the first long sides 41a to a corresponding one of the second long sides 41b; and the first long sides 41a of each second trench 4a are parallel to the first trenches 3a.

Moreover, each of the corner portions may be composed of many interconnected first short sides 42a and second short sides 42b. In this design, all of the first short sides 42a are parallel to the first long sides 41a (i.e., extend in the X-direction) and all of the second short sides 42b are parallel to the second long sides 41b (i.e., extend in the Y-direction). Additionally, each of the corner portions has one end connected to a corresponding one of the first long sides 41a via a certain one of its second short sides 42b and has the other end connected to a corresponding one of the second long sides 41b via a certain one of its first short sides 42a. Moreover, the first short sides 42a and second short sides 42b of each corner portion are alternately connected together. In addition, in each of the corner portions, the first short sides 42a may have an identical length or not, and similarly, the second short sides 42b may also have an identical length or not. Furthermore, in each corner portion, a same end of each of the first short sides 42a, for example, the end that is farther from the current-flowing area, namely, the outer end, may be located on a single arc (e.g., the arc S as shown in FIG. 3), and the arc curves away from the current-flowing area.

In this embodiment, Miller indices of sidewalls and bottom face of each first trench 3a, Miller indices of sidewalls and bottom face of any portion of each second trench 4a, and Miller indices of the semiconductor substrate 1 all belong to the {100} family of crystal planes.

The second trenches 4a may have an identical width which is equal to the width of a first trench 3a. In one embodiment, the first trenches 3a and the second trenches 4a each have an identical width of 1 µm to 10 µm, and more preferably, 5 µm. Moreover, spacings between every two adjacent second trenches 4a may be identical or not.

In this embodiment, all of the first trenches 3a and the second trenches 4a are filled with a P-type semiconductor epitaxial material, which may be a boron doped silicon epitaxial material. Additionally, portions of the P-type semiconductor epitaxial material filled in the first trenches 3a respectively form first P-type pillars 3, each of which may have a uniform or non-uniform resistivity. Moreover, portions of the P-type semiconductor epitaxial material filled in the second trenches 4a respectively form second P-type pillars 4. In addition, portions of the N-type semiconductor epitaxial layer 2 between every two adjacent P-type pillars respectively form N-type pillars. Furthermore, all the N-type pillars and the P-type pillars are alternately arranged.

Figure 1:
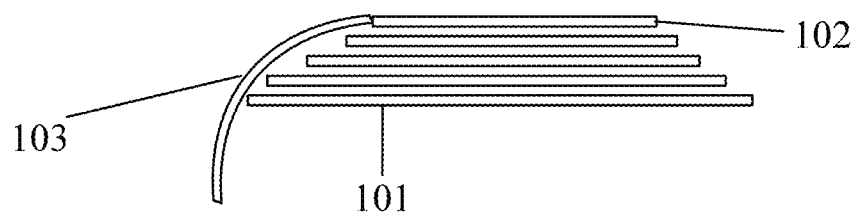
FIG. 1 is a top view schematically illustrating a corner portion of a conventional superjunction device.
Figure 2:
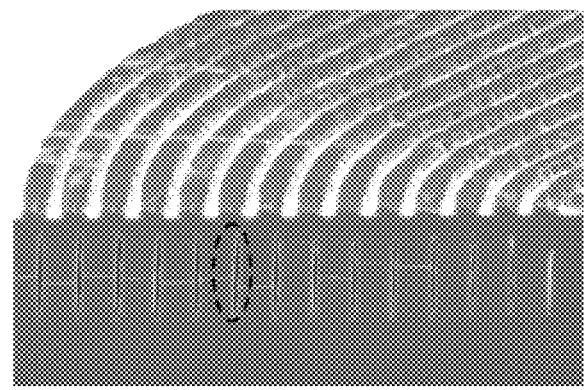
FIG. 2 is an illustration of the silicon epitaxial layer filling result of the corner portion of the conventional superjunction device.
Figure 5:
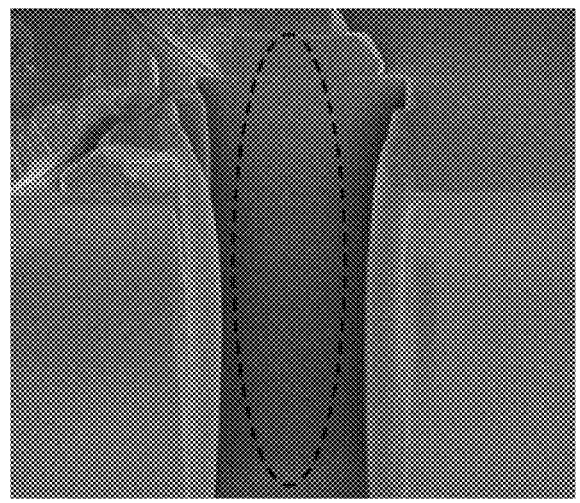
FIG. 5 is an illustration of the silicon epitaxial layer filling result of a corner portion of the superjunction device according to the present invention.

As indicated above, as all corner portions of each second trench 4a are composed of perpendicular sides, namely, the first short sides 42a and the second short sides 42b that are perpendicular to each other, it is ensured that the Miller indices of trench facets in every corner portion of each second trench 4a belong to the same {100} family of crystal planes. Therefore, corner portions of each P-type pillar 4 can be properly formed with no defects generated therein by a silicon epitaxial layer filling process. FIG. 5 is an illustration of the silicon epitaxial layer filling result of a corner portion of the superjunction device according to the present invention. As can be found by comparing with FIG. 2, there are no voids present in the superjunction device of FIG. 5.

Turning to FIG. 4, in this embodiment, the superjunction device may further include, in the current-flowing area:

P-type wells 6 (i.e., base regions), each of which may be formed on top of a corresponding P-type pillar 3, or be formed around an upper portion of a corresponding P-type pillar 3 and extend on both sides into the N-type pillars adjacent to the P-type pillar 3;

N-type source regions 5 formed in each P-type well 6;

insulated control electrodes 8 formed on the semiconductor epitaxial layer 2 that defines the current-flowing area, wherein each insulated control electrode 8 is composed of a gate dielectric layer 10 and a gate electrode 9, and wherein each insulated control electrode 8 covers a portion of each well 6 and hence forms a channel region which can generate a channel current to connect a corresponding N-type source region 5 and a corresponding N-type pillar;

an insulating passivation layer 7 covering top and sides of each insulated control electrode 8;

a source 11 composed of a continuous first metal layer that covers the insulating passivation layers 7 and is connected to the source regions 5; and a drain 12 composed of a second metal layer formed over a back side of the semiconductor substrate 1.

In one embodiment, the superjunction device may be manufactured by a method including the steps of:

providing an N-type silicon substrate as the semiconductor substrate 1, wherein the semiconductor substrate 1 is doped with arsenic (As) or antimony (Sb) and has a resistivity of 0.001 Ω·cm to 0.009 Ω·cm;

growing an N-type semiconductor epitaxial layer 2 on a surface of the semiconductor substrate 1 which has a Miller index of {100}, wherein the semiconductor epitaxial layer 2 is a phosphorus doped silicon epitaxial layer having a resistivity of 1 Ω·cm to 10 Ω·cm and a thickness of 50 µm;

forming source regions 5 and wells 6 in the semiconductor epitaxial layer 2;

growing a deep trench etch stop layer (i.e., a hard mask layer) or a chemical mechanical polishing (CMP) stop layer, wherein the stop layer may be formed of an oxide, a nitride or a nitric oxide, and wherein the stop layer may be one composed of a single layer or multiple layers (e.g., a first oxide layer and a second oxide layer, or an oxide layer and a nitride layer, or a first oxide layer and a nitride layer and a second oxide layer);

defining regions for forming deep trenches and etching the regions to form the first trenches 3a and the second trenches 4a, wherein all corner portions of each second trench 4a are composed of perpendicular sides, namely, the first short sides 42a and the second short sides 42b that are perpendicularly arranged, wherein the Miller indices of sidewalls and bottom faces facets of both the resulting first trenches 3a and second trenches 4a belong to the {100} family of crystal planes, wherein the first trenches 3a and the second trenches 4a each have an identical width of 5 µm, which means the first short sides 42a and the second short sides 42b of the corner portions of the second trenches 4a also have an identical width of 5 µm; both the first trenches 3a and the second trenches 4a have an identical depth of 45 µm; every two adjacent first trenches 3a have an identical spacing, and the spacings between every two adjacent second trenches 4a may be identical or not;

removing the photoresist (if there is) and part of or the entire hard mask layer by etching, and thereafter forming a P-type semiconductor epitaxial material on a front side of the semiconductor substrate 1 using an epitaxial growth process, wherein the semiconductor epitaxial material is a boron doped silicon epitaxial material, wherein as the Miller indices of sidewalls and bottom faces of both the first trenches 3a and the second trenches 4a belong to the same {100} family of crystal planes, the semiconductor epitaxial material completely fills the first trenches 3a and the second trenches 4a with no defects such as voids generated in the corner portions of the second trenches 4a, wherein portions of the P-type semiconductor epitaxial material that are filled in the first trenches 3a respectively form first P-type pillars 3, each of which may have a uniform or non-uniform resistivity, wherein portions of the P-type semiconductor epitaxial material filled in the second trenches 4a respectively form second P-type pillars 4, wherein portions of the N-type semiconductor epitaxial layer 2 between every two adjacent P-type pillars respectively form the N-type pillars, and wherein all the N-type pillars and the P-type pillars are alternately arranged;

planarizing the resulting structure using a CMP process to flat surface of the first trenches 3a and the second trenches 4a and remove portions of the semiconductor epitaxial material that is higher than the upper edges of the first trenches 3a and the second trenches 4a; after that, removing the entire hard mask layer using an etching process;

forming the gate dielectric layers 10 (e.g., silicon dioxide layers) and the gate electrodes 9 (e.g., polysilicon electrodes), defining regions for forming insulated control electrodes and etching the regions to form the insulated control electrodes 8;

forming a passivation material and patterning and etching the passivation material to form the passivation layers 7 each of which completely covers a corresponding insulated control electrode 8;

depositing a first metal layer (e.g., an aluminum layer) and patterning and etching the first metal layer to form a source 11; and thinning a back side of the semiconductor substrate 1 and depositing a second metal layer (e.g., a silver alloy layer) thereon to form a drain 12.

While specific embodiments have been presented in the foregoing description of the invention, they are not intended to limit the invention in any way. Those skilled in the art can make various modifications and variations without departing from the scope of the invention. Thus, it is intended that the present invention covers all such modifications and variations.

What is claimed is:

1. A superjunction device, comprising:
   a semiconductor substrate having a first conductivity type;
   a semiconductor epitaxial layer having a first conductivity type, the semiconductor epitaxial layer being formed on the semiconductor substrate;
   a current-flowing area formed in the semiconductor epitaxial layer, the current-flowing area including a plurality of parallel arranged first trenches, each of the first trenches extending along a surface of the semiconductor substrate epitaxial layer in a first direction perpendicular to a direction of depth;
   a termination structure formed in the semiconductor epitaxial layer and enclosing the current-flowing area, the termination structure including a plurality of parallel arranged and substantially annular-shaped second trenches, each of the second trenches including a plurality of alternately arranged first sides and second sides, each of the first sides extending in the first direction, each of the second sides extending in a second direction both perpendicular to the first direction and the direction of depth; and
   a semiconductor epitaxial material having a second conductivity type, the semiconductor epitaxial material being filled in each of the first and second trenches,
   wherein the semiconductor epitaxial material filled in the first and second trenches form pillars having a second conductivity type, and portions of the semiconductor epitaxial layer between every two adjacent pillars having a second conductivity type form pillars having a first conductivity type, and wherein the pillars having a first conductivity type and the pillars having a second conductivity type are alternately arranged.

2. The superjunction device according to claim 1, wherein the semiconductor substrate is a silicon substrate, the semiconductor epitaxial layer is a silicon epitaxial layer, and the semiconductor epitaxial material is a silicon epitaxial material.

3. The superjunction device according to claim 2, wherein Miller indices of sidewalls and bottom face of each of the first trenches, Miller indices of sidewalls and bottom face of any portion of each of the second trenches, and Miller indices of the semiconductor substrate all belong to the {100} family of crystal planes.

4. The superjunction device according to claim 1, wherein the first conductivity type and the second conductivity type are respectively N type and P type, or respectively P type and N type.

5. The superjunction device according to claim 1, wherein every two adjacent first trenches have an identical spacing, and wherein the first trenches have an identical width.

6. The superjunction device according to claim 1, wherein each of the pillars having a second conductivity type filled in a corresponding one of the first trenches has a uniform or non-uniform resistivity.

7. The superjunction device according to claim 1, wherein each of the second trenches includes:
   a pair of first long sides parallel arranged and extending in the first direction;
   a pair of second long sides parallel arranged and extending in the second direction; and
   four corner portions, each formed by connecting a plurality of first short sides extending in the first direction and a plurality of second short sides extending in the second direction, each of the corner portions connecting one end of one of the pair of first long sides and an adjacent end of an adjacent one of the pair of second long sides.

8. The superjunction device according to claim 7, wherein first ends of the first short sides of each corner portion are located on an arc, the first end being an end that is farther from the current-flowing area, the arc curving away from the current-flowing area.

9. The superjunction device according to claim 1, wherein spacings between every two adjacent second trenches are identical.

10. The superjunction device according to claim 1, wherein each of the second trenches has an identical width which is equal to a width of the first trench.

11. The superjunction device according to claim 1, further comprising, in the current-flowing area:
    a well having a second conductivity type formed on top of each of the pillars having a second conductivity type in the current-flowing area;
    source regions having a first conductivity type formed in each well;
    insulated control electrodes formed on the semiconductor epitaxial layer, each of the insulated control electrodes being composed of a gate dielectric layer and a gate electrode;
    an insulating passivation layer covering each insulated control electrode;
    a source composed of a first metal layer that covers the insulating passivation layers and is connected to the source regions; and
    a drain composed of a second metal layer over a back side of the semiconductor substrate.

* * * * *